US010712599B2

(12) United States Patent
Maemuko

(10) Patent No.: US 10,712,599 B2
(45) Date of Patent: Jul. 14, 2020

(54) DISPLAY DEVICE

(71) Applicant: Japan Display Inc., Tokyo (JP)

(72) Inventor: Masanori Maemuko, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/230,113

(22) Filed: Dec. 21, 2018

(65) Prior Publication Data

US 2019/0204660 A1 Jul. 4, 2019

(30) Foreign Application Priority Data

Dec. 28, 2017 (JP) ................................ 2017-254643

(51) Int. Cl.
| | | |
|---|---|---|
| G02F 1/1333 | (2006.01) | |
| F21V 8/00 | (2006.01) | |
| G02F 1/1345 | (2006.01) | |
| H05K 9/00 | (2006.01) | |
| H05K 1/02 | (2006.01) | |
| H01R 12/70 | (2011.01) | |
| H01R 12/79 | (2011.01) | |
| H01R 12/71 | (2011.01) | |

(52) U.S. Cl.
CPC ..... *G02F 1/133308* (2013.01); *G02B 6/0083* (2013.01); *G02F 1/13452* (2013.01); *H05K 9/0054* (2013.01); *G02F 2001/133314* (2013.01); *G02F 2001/133334* (2013.01); *H01R 12/7047* (2013.01); *H01R 12/714* (2013.01); *H01R 12/79* (2013.01); *H05K 1/0215* (2013.01)

(58) Field of Classification Search
CPC .......... H05K 2201/10128; H05K 2201/10136; H05K 2201/10; H05K 2201/09063; H05K 9/0058; H05K 9/0054; H05K 1/0215; H05K 9/0026; H05K 1/117; H05K 2201/10409; H05K 1/147; H05K 2201/10371; H05K 2201/0999; G02B 6/0088; G02B 6/0081; G02B 6/0083; G02F 1/133308; G02F 2001/133322; G02F 1/133305; G02F 1/13452; G02F 2001/133334; H01R 12/714; H01R 12/7047; H01R 12/79; H01R 4/34; H01R 4/10136; H01L 51/5237
See application file for complete search history.

(56) References Cited

U.S. PATENT DOCUMENTS

2005/0099402 A1* 5/2005 Nakanishi ............. G06F 3/0412
345/173
2005/0241758 A1* 11/2005 Kim .................... G02F 1/13452
156/308.2

(Continued)

FOREIGN PATENT DOCUMENTS

| JP | 2008-185764 A | 8/2008 |
|---|---|---|
| JP | 2012-252784 A | 12/2012 |

*Primary Examiner* — Britt D Hanley
*Assistant Examiner* — Fatima N Farokhrooz
(74) *Attorney, Agent, or Firm* — K&L Gates LLP

(57) ABSTRACT

According to an aspect, a display device includes: a display panel; a light source; a housing that houses the display panel; a printed circuit board that is fixed to a mounting surface of the housing on an opposite side of a surface of the housing facing the display panel; a flexible printed circuit board that electrically couples the light source and the printed circuit board; and a flexible printed circuit cover that covers the flexible printed circuit board.

6 Claims, 8 Drawing Sheets

(56) References Cited

U.S. PATENT DOCUMENTS

| | | | |
|---|---|---|---|
| 2006/0274224 A1* | 12/2006 | Jeong | G02B 6/0088 349/58 |
| 2007/0007880 A1* | 1/2007 | Yang | H01J 9/248 313/496 |
| 2007/0024771 A1* | 2/2007 | Shinohara | G02B 6/0081 349/58 |
| 2007/0279568 A1* | 12/2007 | Kim | G02F 1/13452 349/149 |
| 2008/0180931 A1 | 7/2008 | Ogawa | |
| 2010/0220496 A1* | 9/2010 | Kim | G02F 1/13452 362/606 |
| 2010/0293782 A1* | 11/2010 | Yamazaki | H01L 51/0097 29/825 |
| 2011/0116015 A1* | 5/2011 | Yakura | G02B 6/0091 349/67 |
| 2011/0122597 A1* | 5/2011 | Kim | G02F 1/13452 361/818 |
| 2011/0134371 A1* | 6/2011 | Shimojoh | G02B 6/0083 349/65 |
| 2011/0141397 A1* | 6/2011 | Lee | G02B 6/0083 349/64 |
| 2011/0255251 A1* | 10/2011 | Kitagawa | G02B 6/0083 361/751 |
| 2011/0261284 A1* | 10/2011 | Hong | G02F 1/133308 349/58 |
| 2012/0147573 A1* | 6/2012 | Lim | H05K 9/0028 361/753 |
| 2012/0307507 A1 | 12/2012 | Arita | |
| 2013/0002982 A1* | 1/2013 | Momose | G02B 6/0046 349/64 |
| 2014/0192279 A1* | 7/2014 | Akanuma | H04M 1/0266 349/12 |
| 2015/0077950 A1* | 3/2015 | Tashiro | H05K 1/0281 361/749 |
| 2016/0019019 A1* | 1/2016 | Ikeda | G06F 3/0412 345/173 |
| 2016/0150640 A1* | 5/2016 | Sugawara | H05K 1/0274 362/612 |
| 2017/0181295 A1* | 6/2017 | Gu | F16M 11/18 |

* cited by examiner

DISPLAY DEVICE

CROSS-REFERENCE TO RELATED APPLICATIONS

This application claims priority from Japanese Application No. 2017-254643, filed on Dec. 28, 2017, the contents of which are incorporated by reference herein in its entirety.

BACKGROUND

1. Technical Field

The present disclosure relates to an electronic apparatus, such as a display device, including a shield cover that shields a printed circuit board.

2. Description of the Related Art

An electronic apparatus such as a display device disclosed in Japanese Patent Application Laid-open Publication No. 2008-185764 uses a metal shield cover to shield electronic components mounted on a printed circuit board.

A flexible printed circuit board that supplies power to a light source has been known, as disclosed in Japanese Patent Application Laid-open Publication No. 2012-252784, for example.

The flexible printed circuit board that supplies power to the light source is electrically coupled to a printed circuit board through a connector on the printed circuit board. Application of external force to the flexible printed circuit board may make electric coupling between the flexible printed circuit board and the printed circuit board unstable.

For the foregoing reasons, there is a need for a display device in which the mounting state of a flexible printed circuit board is stable.

SUMMARY

According to an aspect, a display device includes: a display panel; a light source; a housing that houses the display panel; a printed circuit board that is fixed to a mounting surface of the housing on an opposite side of a surface of the housing facing the display panel; a flexible printed circuit board that electrically couples the light source and the printed circuit board; and a flexible printed circuit cover that covers the flexible printed circuit board.

DETAILED DESCRIPTION

Figure 1:
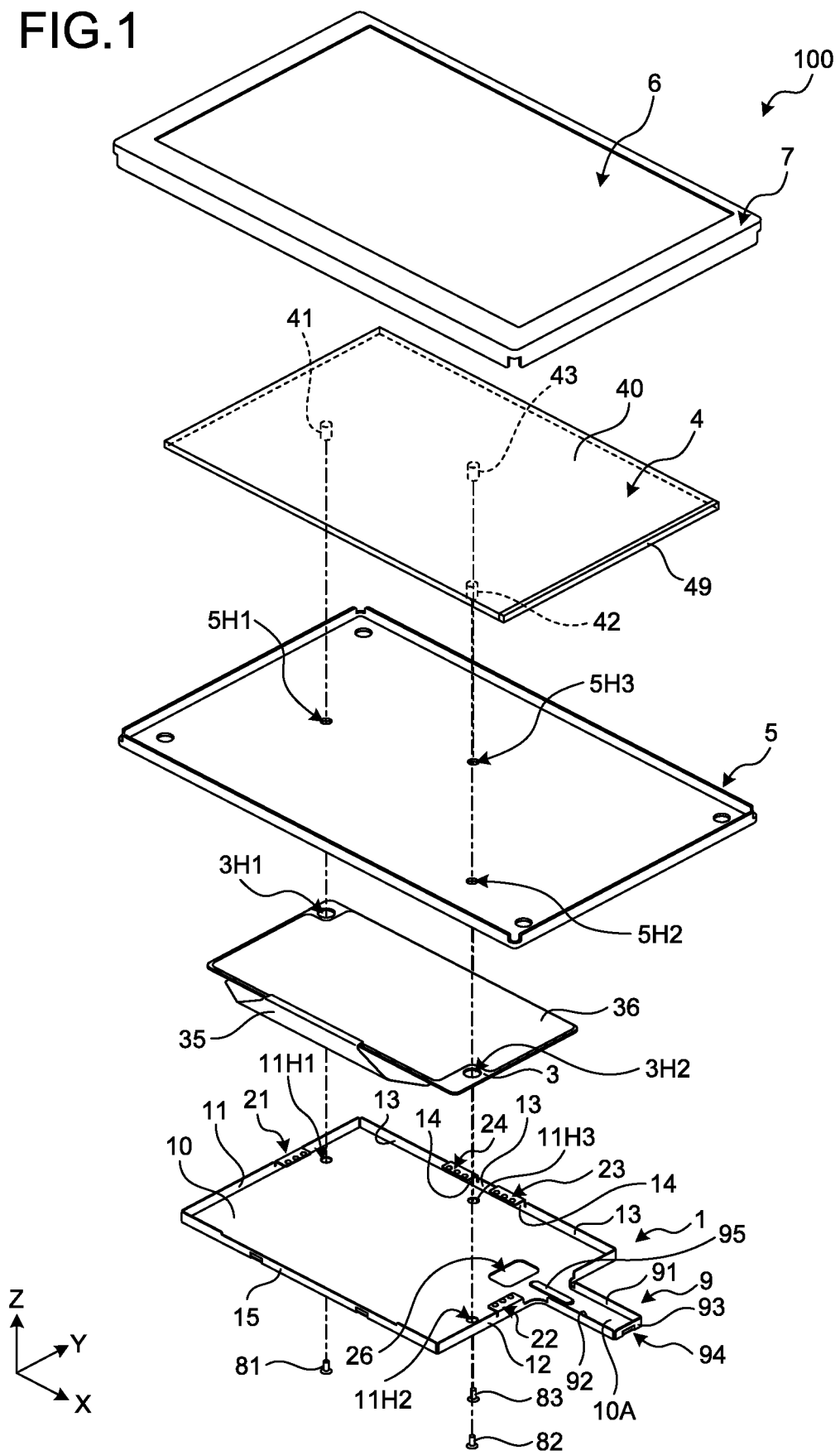
FIG. 1 is an exploded perspective view of a display device according to an embodiment.

A mode for carrying out the present disclosure (embodiment) will be described in detail with reference to the drawings. Contents described in the following embodiment do not limit the present disclosure. Components described below include components easily conceivable by those skilled in the art and components substantially identical therewith. Furthermore, the components described below can be appropriately combined. The disclosure is given by way of example only, and various changes made without departing from the spirit of the disclosure and easily conceivable by those skilled in the art are naturally included in the scope of the disclosure. The drawings may possibly illustrate the width, the thickness, the shape, and the like of each unit more schematically than the actual aspect to simplify the explanation. These elements, however, are given by way of example only and are not intended to limit interpretation of the present disclosure. In the specification and the drawings, components similar to those previously described with reference to a preceding drawing are denoted by like reference numerals, and detailed explanation thereof will be appropriately omitted. In this disclosure, when an element A is described as being "on" another element B, the element A can be directly on the other element B, or there can be one or more elements between the element A and the other element B.

FIG. 1 is an exploded perspective view of a display device according to an embodiment. A display device 100 is installed in, for example, a dashboard of an automobile and is used for navigation display in a car navigation system, display on an audio operation screen, playback of a movie, display of meters such as velocity indication. As illustrated in FIG. 1, the display device 100 includes a display panel 6, a front case 7, a backlight 4, a back plate 5, a printed circuit board 3, and a shield cover 1.

The display panel 6 is a liquid crystal display panel having two translucent substrates and liquid crystal sealed between the two translucent substrates. The display panel 6 displays an image by changing light transmissivity on each pixel in accordance with image signals. One direction of a plane of the display panel 6 is referred to as an X direction; a direction orthogonal to the X direction on the plane of the display panel 6 is referred to as a Y direction; and a direction orthogonal to the X-Y plane is referred to as a Z direction. When viewed in the Z direction, a display surface side (or upper surface side) refers to a side which a display surface (or upper surface) to display an image faces; and a back surface side (or lower surface side) refers to a side which a back surface (or lower surface) opposite to the display surface faces.

One end of a flexible printed circuit board (hereinafter, referred to as a flexible printed circuit (FPC) substrate) 35 is coupled to the display panel 6.

The other end of the FPC substrate 35 is coupled to the printed circuit board 3 to transmit control signals to the display panel 6, and control display operation. A protection cover may be disposed on the display surface side of the display panel 6. The protection cover is a translucent member that covers and protects the display surface of the display panel 6. The translucent member includes glass, a translucent resin member, and a touch panel.

The backlight 4 is disposed on the back surface side of the display panel 6. The backlight 4 emits light toward the display panel 6 and causes the light to be incident on the entire surface of a display region. The backlight 4 includes a backlight main body 40 and bosses 41, 42, and 43, for example. The backlight main body 40 includes a light source 49 such as a light emitting diode, and a light guide plate to guide light emitted from the light source toward the back surface of the display panel 6. The bosses 41, 42, and 43 protrude from the backlight main body 40 toward the back surface side. The bosses 41, 42, and 43 have respective female screw parts on their back surfaces.

The front case 7 and the back plate 5 are assembled to form a housing. The display panel 6 and the backlight 4 are housed in an inner space surrounded by the front case 7 and the back plate 5.

The back plate 5 is formed by bending a plate-like metal member. The back plate 5 has a plurality of through-holes including through-holes 5H1, 5H2, and 5H3.

Figure 3:
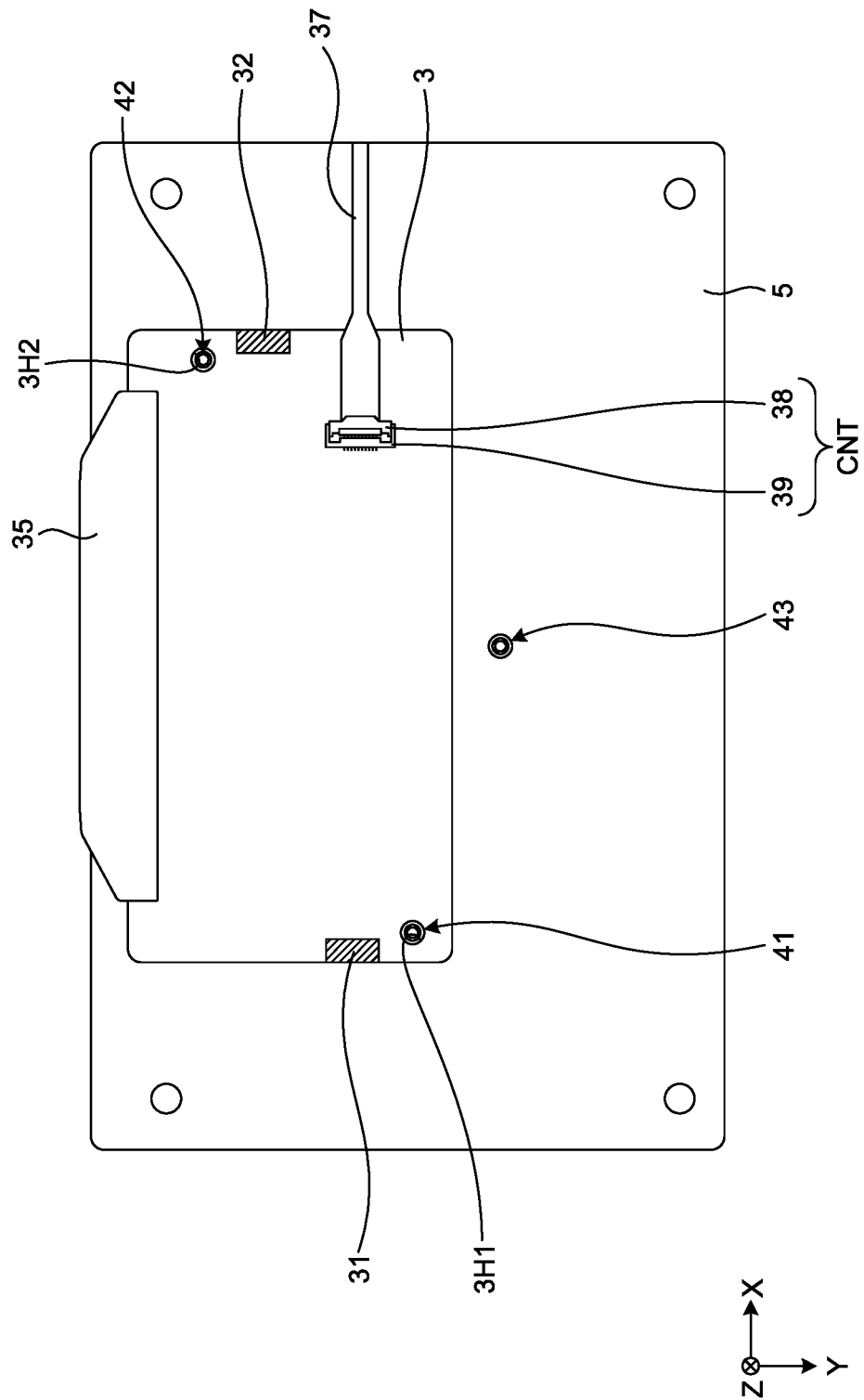
FIG. 3 is a back view illustrating a state of a printed circuit board fixed to a back plate.

FIG. 3 is a back view illustrating a state of a printed circuit board fixed to the back plate. The printed circuit board 3 has electronic components (not illustrated) mounted thereon. The printed circuit board 3 has through-holes 3H1 and 3H2. An insulating resin film 36 is interposed between the printed circuit board 3 and the back plate 5

As illustrated in FIG. 1, the printed circuit board 3 is disposed on the back surface side of the back plate 5. The through-hole 3H1 overlaps the through-hole 5H1 of the back plate 5. The boss 41 of the backlight main body 40 is inserted into the through-hole 5H1 of the back plate 5 and into the through-hole 3H1 of the printed circuit board 3. The through-hole 3H2 overlaps the through-hole 5H2 of the back plate 5. The boss 42 of the backlight main body 40 is inserted into the through-hole 5H2 of the back plate 5 and into the through-hole 3H2 of the printed circuit board 3.

Figure 2:
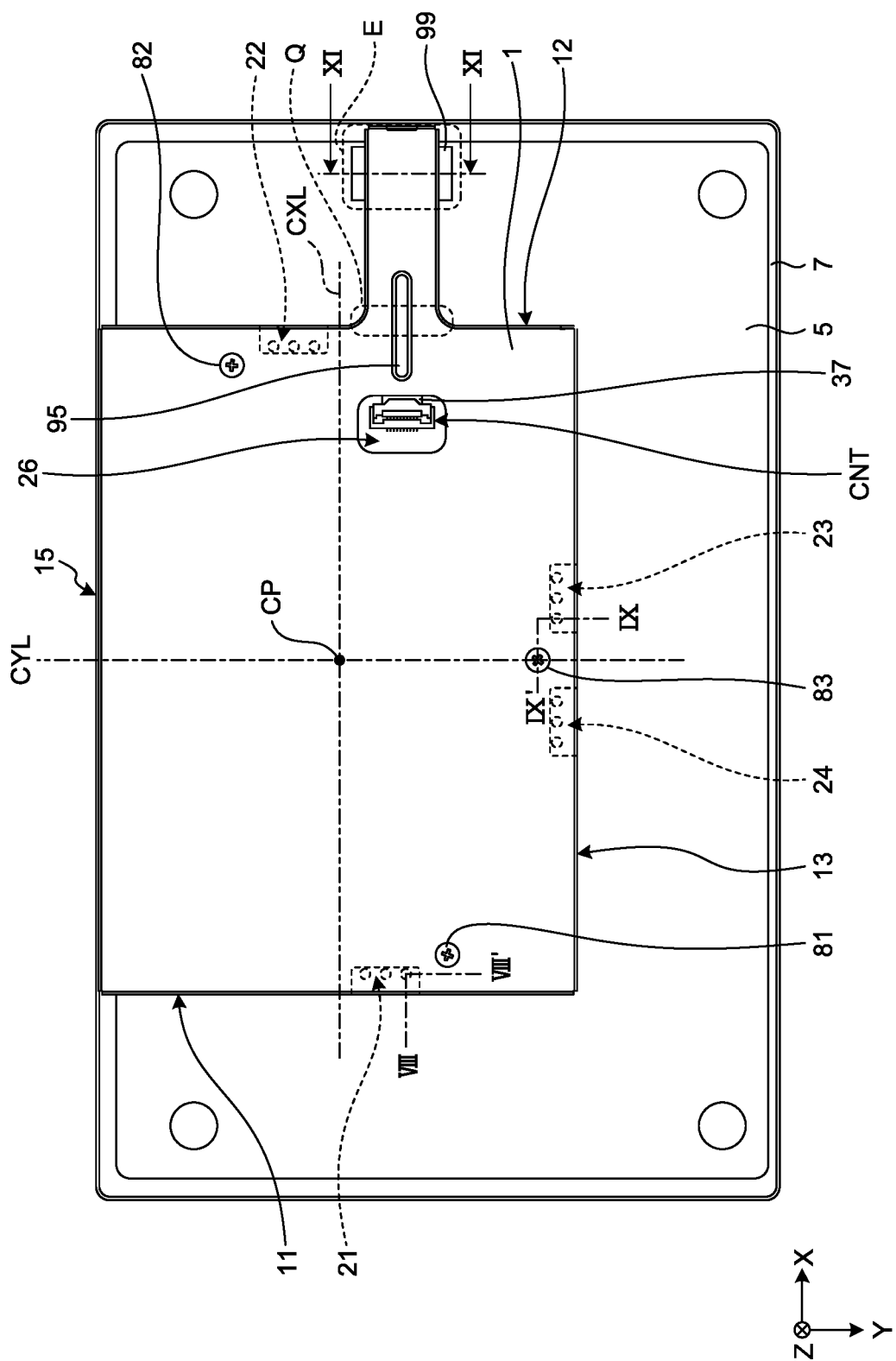
FIG. 2 is a back view of the display device.

As illustrated in FIGS. 2 and 3, one end of a flexible printed circuit board (hereinafter, referred to as a flexible printed circuit (FPC) substrate) 37 is coupled to the printed circuit board 3 through a connector CNT. The other end of the FPC substrate 37 is coupled to the light source 49 of the backlight 4 (see FIG. 1). The connector CNT includes a connector main body 39 and a lock 38. The connector main body 39 includes conductive terminals. The lock 38 holds the FPC substrate 37 together with the connector main body 39 and fixes the position of the FPC substrate 37.

As illustrated in FIG. 3, the printed circuit board 3 has ground patterns 31 and 32 on the back surface. The ground patterns 31 and 32 are coupled to a reference potential of the printed circuit board 3. The through-hole 3H1 of the printed circuit board 3 is in the vicinity of the ground pattern 31. The through-hole 3H2 of the printed circuit board 3 is in the vicinity of the ground pattern 32.

The shield cover 1 is a component to shield electronic components mounted on the printed circuit board 3. The shield cover 1 is formed by bending a plate-like metal member. FIG. 2 is a back view of the display device. As illustrated in FIG. 2, when viewed from the back surface side in the Z direction, the shield cover 1 is larger than the printed circuit board 3 and covers the printed circuit board 3.

Figure 4:
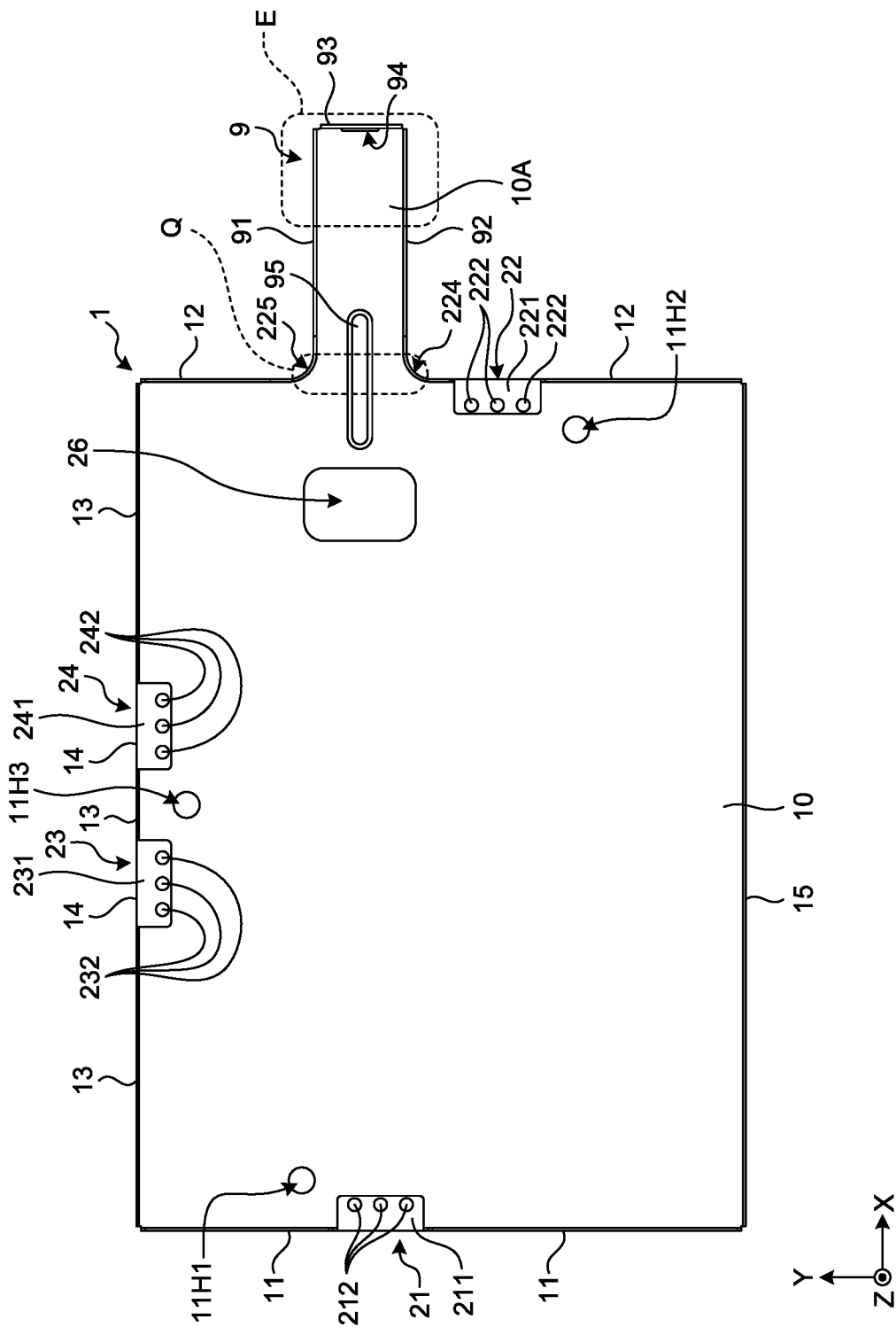
FIG. 4 is a top view of a shield cover.

FIG. 4 is a top view of the shield cover. As illustrated in FIG. 1, FIG. 2, and FIG. 4, the shield cover 1 includes a top plate 10, and side plates 11, 12, 13, 14, and 15 folded along the respective sides of the top plate 10. The side plates 11 faces the side plates 12 in the X direction. The side plates 13 and the side plates 14 face the side plate 15 in the Y direction.

As illustrated in FIG. 1 and FIG. 4, the top plate 10 has through-holes 11H1, 11H2, and 11H3. As illustrated in FIG. 1, the through-hole 11H1 overlaps the through-hole 3H1 and the through-hole 5H1. The through-hole 11H2 overlaps the through-hole 3H2 and the through-hole 5H2. The through-hole 11H3 overlaps the through-hole 5H3.

As illustrated in FIG. 2, the connector CNT can be viewed through the through-hole 26. In other words, the through-hole 26 has a size that allows the entire connector CNT mounted on the printed circuit board 3 and a part of the FPC substrate 37 coupled to the connector CNT to be viewed therethrough. A translucent tape may be attached to the through-hole 26. This tape prevents entry of a foreign substance into the shield cover 1.

The shield cover 1 is integrally formed with a flexible printed circuit board cover (hereinafter, referred to as a flexible printed circuit (FPC) cover) 9 protruding further in the X direction than the side plates 12. The FPC cover 9 includes a top plate 10A and side plates 91, 92, and 93 folded along the respective sides of the top plate 10A. The top plate 10A is coplanar with the top plate 10. That is, the FPC cover 9 is formed by the same metal plate as that forming the shield cover 1.

As illustrated in FIG. 2, the FPC cover 9 has a base portion Q, the width of which is gradually narrowed in a plan view, and has a constant width toward an end portion E. The extending direction of the FPC cover 9 from the shield cover 1 is the X direction, which is identical to the extending direction of the FPC substrate 37 illustrated in FIG. 3.

A rib 95 is a protrusion that is formed by recessing the back surfaces of the top plate 10 and the top plate 10A to the upper surface side so as to protrude further than the upper surfaces of the top plate 10 and the top plate 10A. The rib 95 may be a protrusion that is formed by recessing the upper surfaces of the top plate 10 and the top plate 10A to the back surface side so as to protrude further than the back surfaces of the top plate 10 and the top plate 10A.

The rib 95 is longer in the X direction than in the Y direction. This configuration allows an operator to easily check whether the FPC substrate 37 is linearly inserted into the connector CNT by comparing the width of the FPC substrate 37 with the rib 95. The rib 95 intersects with an extension line of the side plates 12 in a plan view. It is preferable that the center line of the rib 95 in the X direction coincides with the extension line of the side plates 12. If the rib 95 is too long in the X direction, it overlaps the through-hole 26. For this reason, the length of the rib 95 is determined so as to have a predetermined interval from the through-hole 26.

As illustrated in FIG. 4, a notch 225 is formed between the side plate 91 and one of the side plates 12. A notch 224 is formed between the side plate 92 and the other of the side plates 12. Accordingly, application of vertical vibration may cause concentration of stress on the boundary between the top plate 10 and the top plate 10A. Arranging the rib 95 on the base portion Q compensates lowered strength due to the notches 224 and 225, thereby suppressing vibration of the FPC cover 9.

In this manner, the rib 95 extends over the shield cover 1 and the FPC cover 9, so that the shield cover having the larger area can distribute vibration force.

The FPC cover 9 includes the side plates 91, 92, and 93 provided around the periphery of the top plate 10A. With this configuration, the FPC cover 9 can prevent insertion of an operator's finger, a jig, or the like between the top plate 10A and the back plate 5, and prevent application of external force to the FPC substrate 37.

The shield cover 1 further includes a first contact piece 21, a first contact piece 22, a second contact piece 23, and a second contact piece 24, each of which faces the upper surface side of the top plate 10. The first contact piece 21, the first contact piece 22, the second contact piece 23, and the second contact piece 24 are formed by folding parts of the respective side plates 11, 12, 14, and 14 inward.

As illustrated in FIG. 4, the first contact piece 21 and the through-hole 11H1 are disposed in juxtaposition along the side plate 11, their closest side plate. An end portion of the first contact piece 21 in the X direction is closer to the side plate 11 than the center of the through-hole 11H1 is to the side plate 11. The first contact piece 22 and the through-hole 11H2 are disposed in juxtaposition along the side plate 12, their closest side plate. An end portion of the first contact piece 22 in the X direction is closer to the side plate 12 than the center of the through-hole 11H2 is to the side plate 12. The second contact piece 23, the through-hole 11H3, and the second contact piece 24 are disposed in juxtaposition along the side plate 13 (the side plates 14), their closest side plate. A distance from the corresponding side plate 14 to the end portion in the Y direction of the second contact piece 23 is shorter than a distance from the side plate 13 to the center of the through-hole 11H3. A distance from the corresponding side plate 14 to the end portion in the Y direction of the second contact piece 24 is shorter than a distance from the side plate 13 to the center of the through-hole 11H3.

Figure 5:
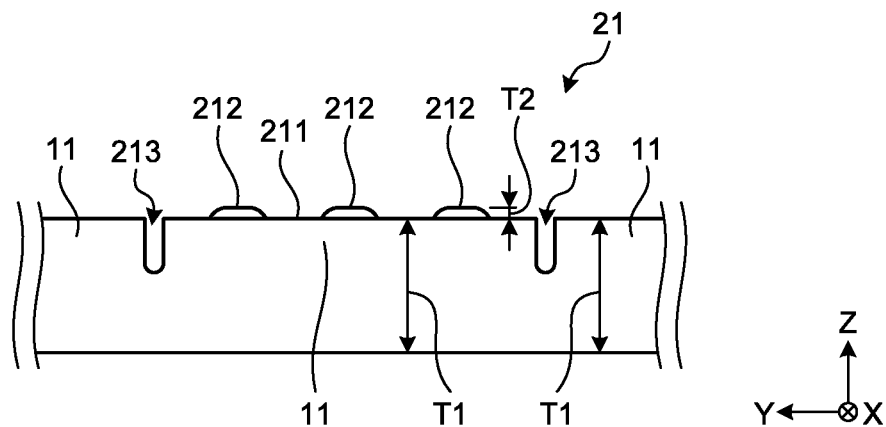
FIG. 5 is a side view of a first contact piece.
Figure 6:
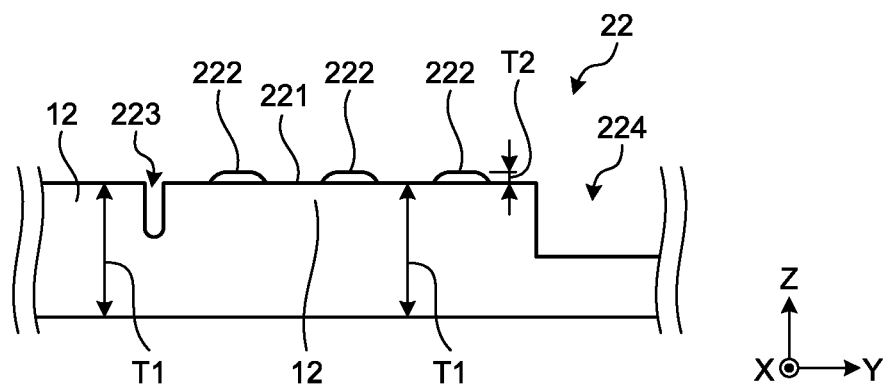
FIG. 6 is a side view of another first contact piece.
Figure 7:
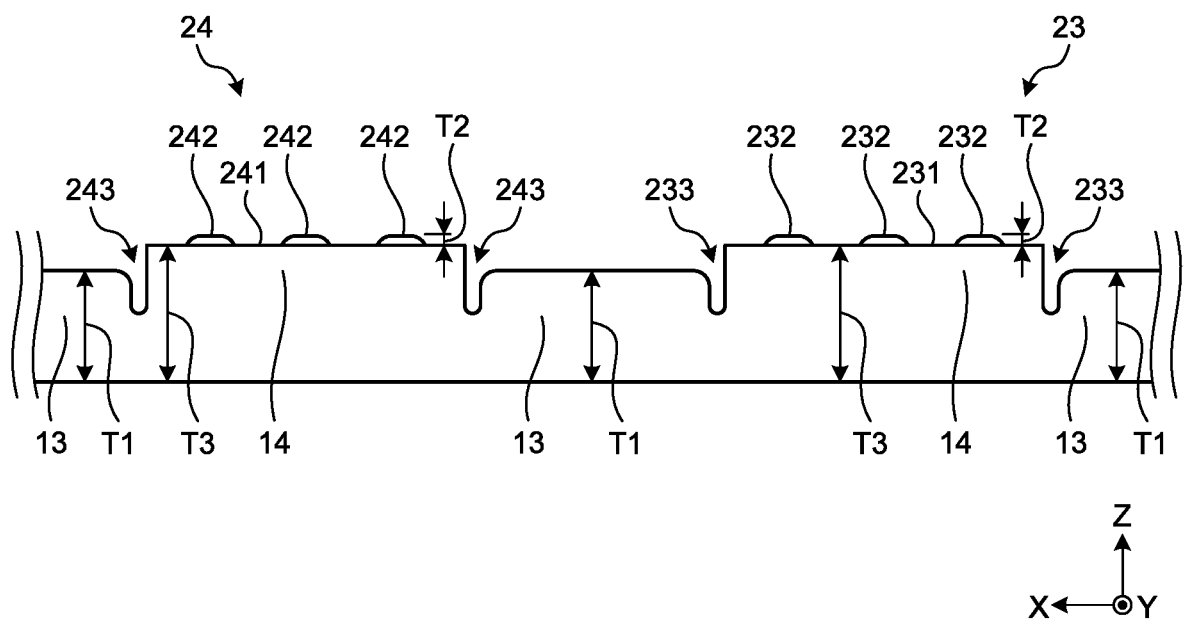
FIG. 7 is a side view of second contact pieces.

FIG. 5 is a side view of the first contact piece. FIG. 6 is a side view of another first contact piece. FIG. 7 is a side view of the second contact pieces. As illustrated in FIGS. 1, 5, 6, and 7, the heights of the side plates 11, 12, and 13 in the Z direction are identical to be a distance T1. As illustrated in FIG. 1, the height of the side plate 15 is identical to the heights of the side plates 11, 12, and 13 in the Z direction.

Figure 8:
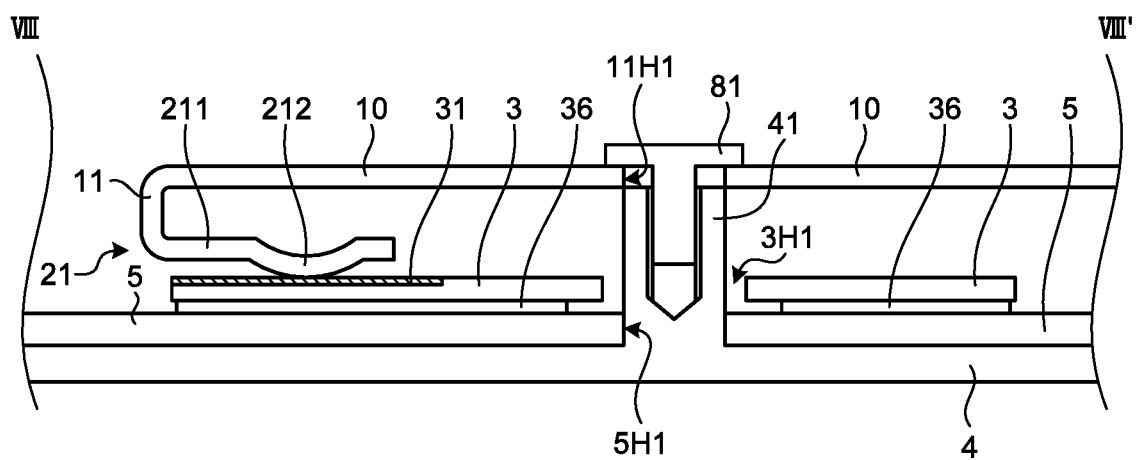
FIG. 8 is a partial cross-sectional view for schematically explaining a cross section along line VIII-VIII' in FIG. 2.

FIG. 8 is a partial cross-sectional view for schematically explaining a cross section along line VIII-VIII' in FIG. 2. As illustrated in FIGS. 4, 5, and 8, the first contact piece 21 includes a plate-like claw 211 and a plurality of protrusions 212 formed by recessing the back surface of the claw 211 to the upper surface side so as to protrude further than the upper surface of the claw 211. The protrusions 212 protrude further than the upper surface of the claw 211 by a distance T2 in the Z direction. As illustrated in FIG. 8, the claw 211, the side plate 11, and the top plate 10 are integrally formed to configure a U-shaped cross-sectional structure. As illustrated in FIGS. 4 and 5, the protrusions 212 are aligned in the Y direction or along one side of the top plate 10.

As illustrated in FIG. 5, notches 213 of the side plate 11 are each formed on either side in the Y direction of the claw 211. With the notches 213, the claw 211 is easily formed by folding a part of the side plate 11.

As illustrated in FIGS. 2, 3, and 8, the first contact piece 21 overlaps the ground pattern 31 in a plan view in the Z direction. As illustrated in FIGS. 1 and 8, when a male screw 81 is fastened with the boss 41, the protrusions 212 of the first contact piece 21 press the ground pattern 31. Accordingly, the ground pattern 31 and the shield cover 1 are electrically conducted with each other.

As illustrated in FIG. 2, a center line CYL of the top plate 10 in the X direction is located midway between the side plate 11 and the side plates 12. A center line CXL of the top plate 10 in the Y direction is located midway between the side plates 13 and 14 and the side plate 15. A reference point CP at the center of the top plate 10 is located at an intersection of the center line CYL and the center line CXL.

As illustrated in FIGS. 4 and 6, the first contact piece 22 includes a claw 221 and a plurality of protrusions 222 formed by recessing the back surface of the claw 221 to the upper surface side so as to protrude further than the upper surface of the claw 221. The protrusions 222 protrude further than the upper surface of the claw 221 by the distance T2 in the Z direction. As illustrated in FIG. 4, the length of the claw 221 in the X direction is identical to the length of the claw 211 in the X direction. The length of the claw 221 in the Y direction is identical to the length of the claw 211 in the Y direction.

The claw 221, the side plate 12, and the top plate 10 are integrally formed to configure a U-shaped cross-sectional structure. As illustrated in FIG. 4, the protrusions 222 are aligned in the Y direction or along one side of the top plate 10.

As illustrated in FIG. 6, notches 223 and 224 of the side plate 12 are formed on respective sides in the Y direction of the claw 221, i.e., the notch 223 is formed on one side of the claw 221, and the notch 224 is formed on the other side of the claw 221. With the notches 223 and 224, the claw 221 is easily formed by folding a part of the side plate 12. The FPC substrate 37 illustrated in FIG. 3 is inserted into the notch 224.

As illustrated in FIG. 1, when a male screw 82 is fastened with the boss 42, the protrusions 222 of the first contact piece 22 press the ground pattern 32 in the same manner as the first contact piece 21. Accordingly, the ground pattern 32 and the shield cover 1 are electrically conducted with each other.

As illustrated in FIG. 7, the heights of the side plates 14 are a distance T3 that is larger than the heights (distance T1) of the side plates 13 in the Z direction. The distance T3 is, for example, larger than the distance T1 by the thickness of the printed circuit board 3 and the thickness of the resin film 36. The height of the second contact piece 23 and that of the second contact piece 24 are each larger than the height of the first contact piece 21 and that of the first contact piece 22 in the Z direction.

Figure 9:
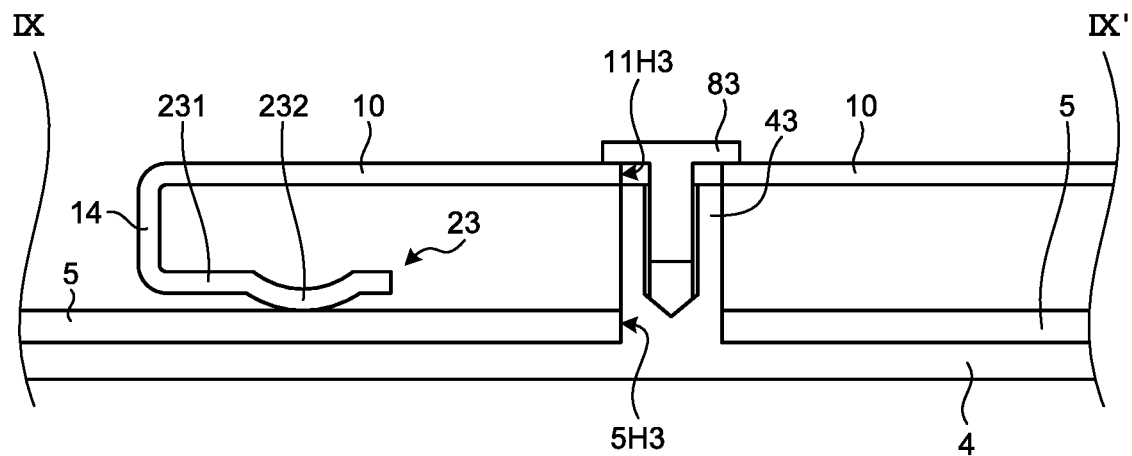
FIG. 9 is a partial cross-sectional view for schematically explaining a cross section along line IX-IX' in FIG. 2.

FIG. 9 is a partial cross-sectional view for schematically explaining a cross section along line IX-IX' in FIG. 2. As illustrated in FIGS. 7 and 9, the second contact piece 23 includes a claw 231 and a plurality of protrusions 232 that are formed by recessing the back surface of the claw 231 to the upper surface side so as to protrude further than the upper surface of the claw 231. As illustrated in FIG. 7, the protrusions 232 protrude further than the upper surface of the claw 231 in the Z direction by the distance T2.

As illustrated in FIG. 9, the claw 231, the side plate 14, and the top plate 10 are integrally formed to configure a U-shaped cross-sectional structure. As illustrated in FIGS. 4 and 7, the protrusions 232 are aligned in the X direction or along one side of the top plate 10.

As illustrated in FIG. 7, the second contact piece 24 includes a claw 241 and a plurality of protrusions 242 that are formed by recessing the back surface of the claw 241 to the upper surface side so as to protrude further than the upper surface of the claw 241. As illustrated in FIG. 7, the protrusions 242 protrude further than the upper surface of the claw 241 in the Z direction by the distance T2.

The claw 241, the side plate 14, and the top plate 10 are integrally formed to configure a U-shaped cross-sectional structure in the same manner as the second contact piece 23. As illustrated in FIGS. 4 and 7, the protrusions 242 are aligned in the X direction or along one side of the top plate 10.

As illustrated in FIG. 7, notches 233 are each formed on either side in the X direction of the claw 231 between the corresponding side plate 13 and the side plate 14. Notches 243 are each formed on either side in the X direction of the claw 241 between the corresponding side plate 13 and the side plate 14. With these notches, the claws 231 and 241 are easily formed by folding parts of the side plates 14. As illustrated in FIG. 4, the lengths of the claws 231 and 241 in the Y direction are identical to the length of the claw 211 in the X direction. The length of the claw 221 in the X direction is identical to the length of the claw 211 in the X direction.

As illustrated in FIG. 9, when a male screw 83 is fastened with the boss 43, the protrusions 232 of the second contact piece 23 press the back plate 5. Although not illustrated in the drawings, when the male screw 83 is fastened with the boss 43, the protrusions 242 of the second contact piece 24 press the back plate 5 in the same manner as the second contact piece 23. Accordingly, the back plate 5 and the shield cover 1 are electrically conducted with each other.

The printed circuit board 3 includes the ground patterns 31 and 32 on the substrate surface and the through-holes 3H1 and 3H2. The bosses 41 and 42 penetrate through at least the through-holes 3H1 and 3H2, respectively, and protrude further than the mounting surface of the back plate 5, on which the printed circuit board 3 is mounted.

The first contact piece 21 includes the protrusions 212 that are formed by recessing a part of the side plate 11 inward; that are brought in contact with the ground pattern 31; and that cause the claw 211 facing the top plate 10 protrude toward the printed circuit board 3 side. The first contact piece 22 includes the protrusions 222 that are formed by recessing a part of the side plate 12 inward; that are brought in contact with the ground pattern 32; and that cause the claw 221 facing the top plate 10 protrude toward the printed circuit board 3 side. The male screw 81 penetrates through the through-hole 11H1 from the outside of the top plate 10 and is fastened with the boss 41; and the male screw 82 penetrates through the through-hole 11H2 from the outside of the top plate 10 and is fastened with the boss 42.

Fastening the male screw 81 with the boss 41 allows the protrusions 212 to stably press the ground pattern 31; and fastening the male screw 82 with the boss 42 allows the protrusions 222 to stably press the ground pattern 32. That is, fastening force between the male screw 81 and the boss 41 is transmitted to the side plates 11, which generates pressing force to press the protrusions 212 against the ground pattern 31; and fastening force between the male screw 82 and the boss 42 is transmitted to the side plates 12, which generates pressing force to press the protrusions 222 against the ground pattern 32. This configuration stabilizes contact resistance between the shield cover 1 and the ground patterns 31 and 32.

As illustrated in FIG. 3, the position of the boss 43 is different from the mounting position of the printed circuit board 3 in a plan view in the Z direction. The boss 43 is fastened with the male screw 83 that has penetrated through the through-hole 11H3 of the top plate 10 from the outside of the top plate 10 without penetrating through the printed circuit board 3. Accordingly, the back plate 5 and the shield cover 1 are electrically conducted with each other.

As illustrated in FIG. 4, the position of the second contact piece 23 and that of the second contact piece 24 are linearly symmetric about the center line CYL in a plan view in the Z direction. The position of the first contact piece 21 and that of the first contact piece 22 are point-symmetric about the reference point CP. As a result, the shield cover 1 is supported at three points.

The relative positions of the male screw 81 and the first contact piece 21 and those of the male screw 82 and the first contact piece 22 are point-symmetric about the reference point CP. The male screws 81, 82, and 83 are fastened to the bosses 41, 42, and 43, respectively, making the shield cover 1 fixed to the back plate 5 at three points. As a result, the shield cover 1 is less likely to be misaligned relative to the back plate 5. The male screws 81, 82, and 83 are fastened to the bosses 41, 42, and 43, respectively, causing the first contact pieces 21 and 22 to press the printed circuit board 3 against the back plate 5. This configuration prevents the printed circuit board 3 from warping.

Figure 10:
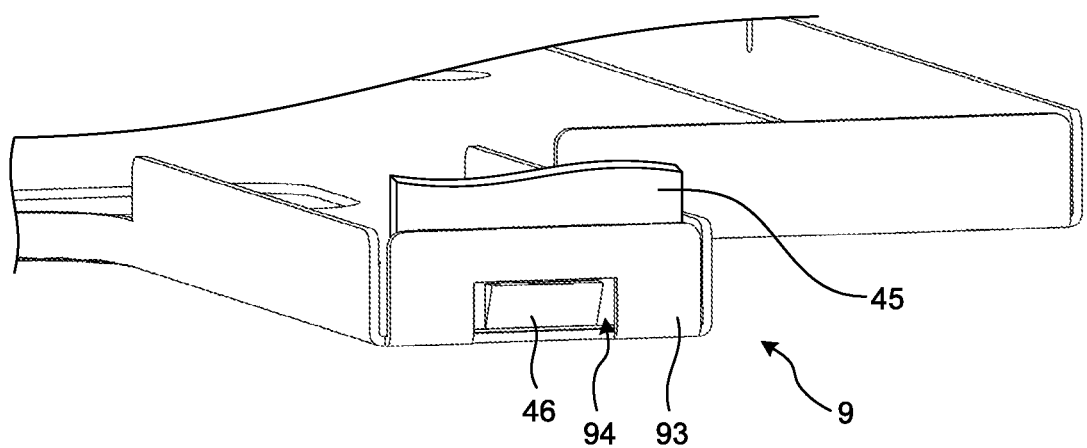
FIG. 10 is a diagram for explaining fixing of a flexible printed circuit (FPC) cover.

As illustrated in FIGS. 1 and 4, the FPC cover 9 includes a through-hole 94 that penetrates through a part of the side plate 93 in the X direction. FIG. 10 is a diagram for explaining fixing of the FPC cover. As illustrated in FIG. 10, a pillar 45 of the backlight main body 40 that protrudes toward the back surface side penetrates through the back plate 5 (not illustrated) and is inserted to the inner side of the side plate 93. The pillar 45 includes a hook 46 protruding in the X direction and having a cross-sectional area in the X-Y plane that is increased toward the upper side.

When the male screws 81, 82, and 83 are respectively fastened with the bosses 41, 42, and 43, the hook portion 46 is fitted into the through-hole 94, which restricts the position of the end portion E of the FPC cover 9, as illustrated in FIG. 10.

The through-hole 3H1 and the ground pattern 31 are disposed in juxtaposition along the side plate 11, the closest side plate to the through-hole 3H1. The ground pattern 31 is closer to the side plate 11 than the through-hole 3H1 is to the side plate 11. This configuration allows fastening force between the male screw 81 and the boss 41 to be easily transmitted through the side plate 11, the fastening force serving as force to press the protrusions 212 against the ground pattern 31.

Likewise, the through-hole 3H2 and the ground pattern 32 are disposed in juxtaposition along the side plate 12, the closest side plate to the through-hole 3H2. The ground pattern 32 is closer to the side plate 12 than the through-hole 3H2 is to the side plate 12. This configuration allows fastening force between the male screw 82 and the boss 42 to be easily transmitted through the side plate 12, the fastening force serving as force to press the protrusions 222 against the ground pattern 32.

In general, the display panel 6 tends to be electrically charged easily. Without measures against static electricity, the static electricity may cause malfunction of electronic components, which drive elements for display, on the printed circuit board. Further, because vehicles such as automobiles have enhanced quiet performance, the display device 100 also needs to exhibit quiet performance. In this regard, the display device 100 according to the embodiment exhibits stable contact resistance between the shield cover 1 and the ground patterns 31 and 32, preventing malfunction of electronic components mounted on the printed circuit board 3. Because the first contact pieces 21 and 22 have spring characteristics, the display device 100, even when mounted on a machine that vibrates such as an automobile, is less likely to generate frictional sound due to friction between the protrusions 212 and the ground pattern 31 and between the protrusions 222 and the ground pattern 32.

In the embodiment, the backlight 4 has the bosses 41 and 42, which penetrate the through-holes 5H1 and 5H2 of the back plate 5, respectively. The male screws 81 and 82 are fastened to the bosses 41 and 42, respectively, causing the backlight 4 to be reliably fixed to the back plate 5. Even when mounted on a machine that vibrates such as an automobile, the display device 100 is less likely to generate frictional sound due to friction between the backlight 4 and the back plate 5.

Figure 11:
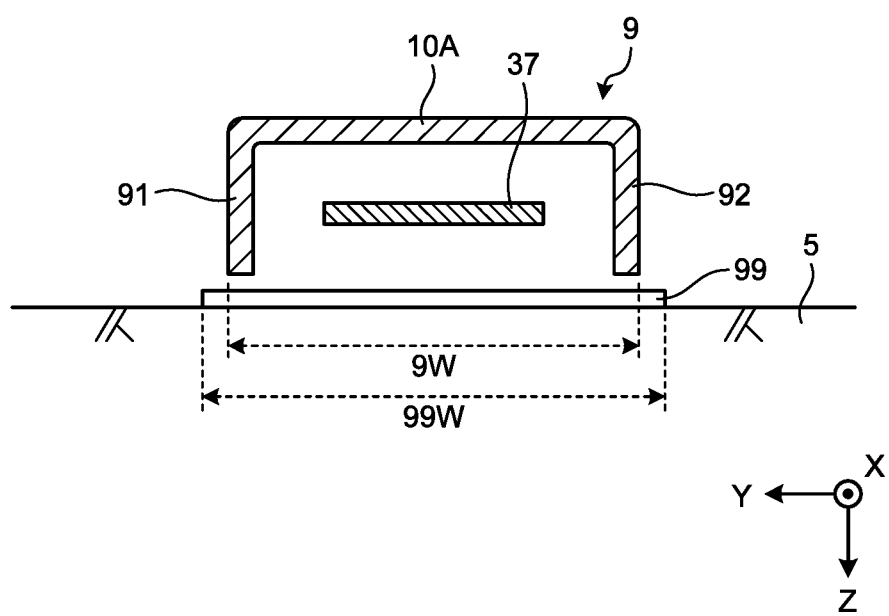
FIG. 11 is a partial cross-sectional view for schematically explaining a cross section along line XI-XI in FIG. 2.

FIG. 11 is a partial cross-sectional view for schematically explaining a cross section along line XI-XI in FIG. 2. As illustrated in FIG. 11, a buffer 99 is interposed between the back plate 5 and the FPC cover 9. The buffer 99 has, for example, a sheet-like shape and is fixed to the back surface of the back plate 5 with an adhesive layer interposed therebetween. For example, polyethylene terephthalate (PET) or a urethane-based resin sheet is used for the buffer 99.

As illustrated in FIGS. 2 and 11, a width 99W of the buffer 99 in the Y direction is larger than a width 9W of the FPC cover 9 in the Y direction. With this configuration, even when the display device 100 is mounted on a machine that vibrates such as an automobile and vibration is transmitted to the FPC cover 9, the FPC cover 9 comes in contact with the buffer 99 before coming in contact with the back plate 5, thereby preventing contact sound between the FPC cover 9 and the back plate 5.

The buffer 99 may be provided in a whole region in the X direction surrounded by the side plates 91 and 92 and the back plate 5. When the FPC cover 9 receives vibration, the vertical vibration is the largest on the end portion E of the FPC cover 9 in the X direction. Arranging the buffer 99 on a part of the back plate 5 at the edge in the X direction decreases the area of the buffer 99, thereby contributing to reduction in cost.

As described above, the display device 100 includes: the display panel 6; the light source 49; and the housing composed of the front case 7 that houses the display panel 6 and the back plate 5. The printed circuit board 3 is fixed to the mounting surface of the housing on the opposite side of the surface of the housing facing the display panel 6. That is, the printed circuit board 3 is fixed to the mounting surface of the back plate 5 on the opposite side of the surface of the back plate 5 facing the display panel 6.

The display device 100 further includes the FPC substrate 37 that electrically couples the light source 49 and the printed circuit board 3. When the FPC substrate 37 is disposed, in an exposed state, on the mounting surface of the back plate 5 on the opposite side of the surface of the back plate 5 facing the display panel 6, an operator's finger or a jig may be caught on the FPC substrate 37, which may loosen the lock 38 fixing the position of the FPC substrate 37. As a result, conduction between the FPC substrate 37 and the connector CNT may become unstable. Further, when the FPC substrate 37 is disposed, in an exposed state, on the mounting surface of the back plate 5 on the opposite side of the surface of the back plate 5 facing the display panel 6, the operator's finger or the jig may be caught on the FPC substrate 37, which may cause disconnection in the FPC substrate 37.

In view of these circumstances, the display device 100 in the embodiment includes the FPC cover 9 covering the FPC substrate 37, as illustrated in FIG. 11. The printed circuit board 3 is located between the back plate 5 serving as the housing and the FPC cover 9, thereby preventing insertion of the operator's finger, the jig, or the like thereinto. This configuration can prevent application of external force to the FPC substrate 37, thereby allowing the display device 100 in the embodiment to stabilize the mounting state of the FPC substrate 37 and conduction between the FPC substrate 37 and the connector CNT. Further, the possibility of disconnection in the FPC substrate 37 is lowered.

The shield cover 1 covers the entire printed circuit board 3. The FPC cover 9 is integrally formed with the shield cover 1 and protrudes from the shield cover 1 along the direction in which the FPC substrate 37 extends in a plan view.

With this configuration, the FPC cover 9 is smaller than the shield cover 1 and can have an outer shape, the size of which depends on the size of the FPC substrate 37. As a result, the FPC cover 9 can be reduced in weight. The FPC cover 9 is integrated with the shield cover 1, thereby reducing external electromagnetic waves reaching the FPC substrate 37.

While an exemplary embodiment according to the present disclosure has been described, the embodiment is not intended to limit the present disclosure. The contents disclosed in the embodiment are given by way of example only, and various changes may be made without departing from the spirit of the present disclosure. Appropriate changes made without departing from the spirit of the present disclosure naturally fall within the technical scope of the present disclosure. For example, an electronic apparatus to which the shield cover 1 according to the embodiment can be applied is not limited to the display device 100, and the shield cover 1 can be applied to a different electronic apparatus. Fastening of each male screw to a corresponding boss is not limited to screwing, and other manners such as self-tapping may be employed. The display panel may be a display panel lighting a self-luminous body, such as an organic light emitting diode (OLED), or an electrophoretic display panel.

The present disclosure can naturally provide other advantageous effects that are provided by the aspects described in the embodiment above and are clearly defined by the description in the present specification or appropriately conceivable by those skilled in the art.

What is claimed is:
1. A display device comprising:
a display panel;
a light source;
a housing including a back plate that houses the display panel;
a printed circuit board that is fixed to a mounting surface of the back plate on an opposite side of a surface of the back plate facing the display panel;
a first flexible printed circuit board that connects the light source and the printed circuit board via a connector, and that overlaps with the mounting surface of the back plate in a plan view, and that extends in a first direction from the printed circuit board;
a second flexible printed circuit board that connects the display panel and the printed circuit board, and that overlaps with the mounting surface of the back plate in a plan view, and that extends in a second direction orthogonal to the first direction from the printed circuit board; and
a shield cover that overlaps with the mounting surface of the back plate in a plan view, and that covers the first flexible printed circuit board and the second flexible printed circuit board, wherein
the shield cover has a first top plate and a second top plate that is integrally formed with the first top plate,
the second top plate has an area smaller than an area of the mounting surface of the back plate and larger than an area of the first top plate, and includes a through-hole overlapping with the connector in a plan view, and covers the printed circuit board and the second flexible printed circuit board,
the first top plate covers the first flexible printed circuit board, and protrudes from the second top plate along the first direction, a width of the first top plate in the second direction is smaller than a width of the second top plate in the second direction, and a size of the through-hole is larger than a size of the connector in a plan view.

2. The display device according to claim 1, further comprising a plurality of side plates that are provided around the first top plate and that extend toward the housing.

3. The display device according to claim 1, further comprising a rib that is formed by irregularities of the first top plate, wherein the rib is arranged on a base portion of the first top plate, a width of the base portion being gradually narrowed in a plan view.

4. The display device according to claim 3, wherein the rib extends over the first top plate and the second top plate.

5. The display device according to claim 1, wherein a buffer is interposed between the back plate of the housing and the first top plate.

6. The display device according to claim 5, wherein the buffer has a sheet-like shape, and a width of the buffer in the second direction is larger than a width of the first top plate.

* * * * *